United States Patent [19]

Kaneko et al.

[11] Patent Number: 5,455,224
[45] Date of Patent: Oct. 3, 1995

[54] METHOD OF PRODUCING COMPOUND OXIDE SUPERCONDUCTING THIN FILM

[75] Inventors: Hiroko Kaneko; Keiji Kaneko; Hideo Ihara, all of Tsukuba; Akira Negishi, Matsudo; Shoji Ishibashi, Tsukuba, all of Japan

[73] Assignee: Agency of Industrial Science & Technology, Ministry of International Trade & Industry, Tokyo, Japan

[21] Appl. No.: 217,098

[22] Filed: Mar. 24, 1994

[30] Foreign Application Priority Data

Apr. 1, 1993 [JP] Japan .................................. 5-098692

[51] Int. Cl.⁶ .......................... H01L 39/24; C25D 11/02
[52] U.S. Cl. .......................... 505/472; 204/130; 205/51; 205/81; 205/83; 205/171; 505/300
[58] Field of Search .................. 205/51, 81, 82, 205/83, 85, 86, 17.1; 505/300, 472; 204/130

[56] References Cited

U.S. PATENT DOCUMENTS 5,157,581 10/1992 Hashemi .................. 361/321
5,286,711 2/1994 Kaneko et al. .................. 501/1

OTHER PUBLICATIONS

Schlenoff, J. B. et al, *Physica C*, 180 (1991) month not available pp. 387–393.
Grenier, J. C. et al, *Physica C*, 173 (1991) month not available pp. 139–144.

*Primary Examiner*—John Niebling
*Assistant Examiner*—William T. Leader
*Attorney, Agent, or Firm*—Oblon, Spivak, McClelland, Maier & Neustadt

[57] ABSTRACT

A method for producing a compound oxide superconducting thin film, comprising forming an oxide thin film on the surface of a substrate of a first metal element having a redox charge by oxidizing the metal, using the oxide thin film thus formed as an electrode for oxidation reaction of a second metal element contained in an electrolyte solution or molten salt to incorporate the second metal element in the oxide thin film, using the compound oxide thin film thus formed as an electrode to obtain a cyclic voltammogram, and electrochemically processing the compound oxide thin film at an electrolytic potential that is determined based on the cyclic voltammogram.

6 Claims, 2 Drawing Sheets

1

METHOD OF PRODUCING COMPOUND OXIDE SUPERCONDUCTING THIN FILM

BACKGROUND OF THE INVENTION

1. Field of the Invention

This invention relates to a method of producing a compound oxide superconducting thin film, and more particularly to a method of producing a superconducting thin film of a compound oxide containing copper, bismuth, vanadium or other such element having a redox charge.

2. Prior Art Statement

Following the discovery by J. G. Bednorz and K. A. Müller of the original oxide superconductor consisting primarily of copper, a number of other oxide superconductors have been developed which use the incorporation and combination of various metal oxides to increase the critical temperature at which superconductivity is exhibited. However, while numerous attempts have been made to develop new superconductors, the lack of any theoretical guidelines for increasing the superconducting critical temperature means that researchers engaged in such development have to rely on the experience they accrue through their work.

The oxide superconductors discovered up to now include among their constituent metal elements at least one element having a redox charge. Moreover, it is known that the element or elements are simultaneously present in different charge states at different portions of one and the same superconductor and that where these different charge states are regulated by oxygen, the oxygen atoms are usually not present in an integer ratio to the metal atoms. It is therefore thought that this presence of oxygen atoms at a non-integer ratio, or the variation in valence number of metal element atoms, has an effect on the characteristics of the superconductor and its critical temperature.

In the case of a superconductor consisting primarily of a copper oxide, methods that have been used to increase the critical temperature at which superconductivity is exhibited include raising the average valence number of the copper by using a flow of gas having an oxygen content that is higher than the atmospheric oxygen content or using a flow of oxygen gas itself, and increasing the ratio of copper (III) in oxygen gas under high pressure.

Superconductors have also been produced in which a substance having a redox charge such as oxides of bismuth (V), rare earth metals, alkaline earth metals and the like have been added to the copper in certain amounts to increase the valence number of the copper.

Thus, such superconductors have been produced by starting with a combination of two or more oxides. However, when the superconductors are formed as thin films for electronic device applications, there have been a number of problems, such as that it is difficult to achieve continuity of superconducting portions, so superconductivity is not readily exhibited.

With respect to most of the high-temperature superconductors that have been previously developed, carrier injection is considered to be an important factor that determines the critical temperature $T_c$ at which superconductivity is exhibited. A carrier injection method disclosed in U.S. Pat. No. 5,286,711 by the present inventors comprised producing an oxide superconductor by an electrochemical oxidation-reduction (redox) method in which the electrolytic potential for the electrochemical processing is determined on the basis of a cyclic voltammogram.

The object of this invention is to provide a method for producing a compound oxide superconducting thin film having a high critical temperature.

SUMMARY OF THE INVENTION

For achieving this object, the present invention provides a method for producing a compound oxide superconducting thin film, comprising forming an oxide thin film on the surface of a substrate of a first metal element having a redox charge by oxidizing the metal, using the oxide thin film thus formed as an electrode for oxidation reaction of a second metal element contained in an electrolyte solution or molten salt to incorporate the second metal element in the oxide thin film, using the compound oxide thin film thus formed as an electrode to obtain a cyclic voltammogram, and electrochemically processing the compound oxide thin film at an electrolytic potential that is determined based on the cyclic voltammogram.

This method according to the present invention uses the metal oxide thin film first formed as an electrode for the oxidation reaction of another metal element contained in an electrolyte solution or molten salt to thereby incorporate the other metal element into the oxide thin film, and an electrolytic processing potential that is determined based on the cyclic voltammogram, whereby superconductivity-imparting oxygen carriers and defects thus introduced into the metal oxide thin film by the other metal element result in a superconducting thin film having an increased critical temperature. The metal element may be supported on a substrate.

Further features of the invention, its nature and various advantages will be more apparent from the accompanying drawings and following detailed description of the invention.

DESCRIPTION OF THE PREFERRED EMBODIMENT

Figure 1:
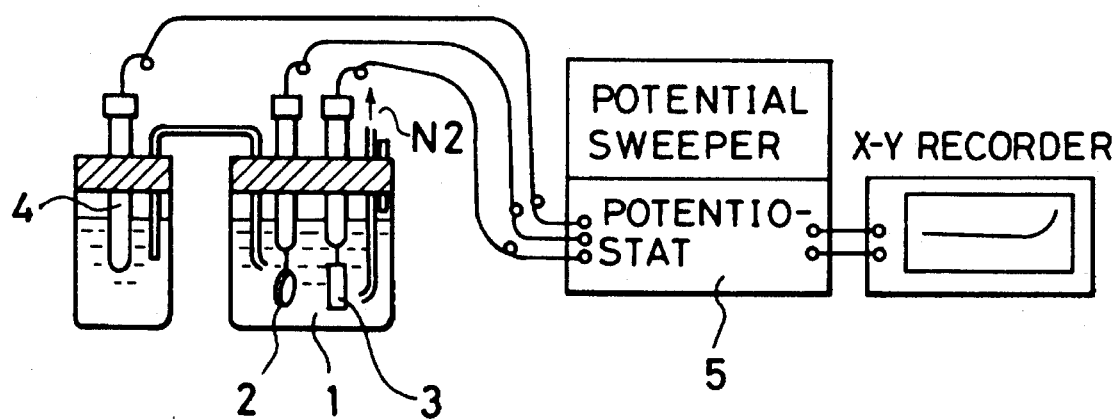
FIG. 1 shows the arrangement of an electrolysis apparatus used to produce a compound oxide thin film according to an embodiment of the present invention.

In the method for producing a compound oxide superconducting thin film according to this invention, a substrate of a first metal element having a redox charge is electrochemically oxidized to form a thin film of an oxide of the metal on the surface of the substrate, and the oxide thin film thus formed is then used as an electrode for an oxidation reaction in an electrolyte solution or molten salt containing another metal element to be used to form a desired compound by being incorporated into the oxide thin film. The compound oxide thin film thus formed is used as an electrode to derive a cyclic voltammogram, and the compound oxide thin film is then electrolyzed at an electrolytic potential determined on the basis of the cyclic voltammagram to thereby achieve superconductivity.

Copper, silver and bismuth are metal elements having a redox charge. The substrate may be constituted by a thin layer of one of these metal elements, or a conventional electrochemical deposition method may be used to constitute the substrate as a thin layer of one of these metal elements on a base of ceramic, carbon, high polymer, glass, semiconductor or other such material able to withstand a temperature of around 250° C. in the case of an aqueous solution, or around 500° C. in the case of a molten salt, and a certain degree of pressure.

Electrochemical oxidation is then used to form a thin film of an oxide of the metal on the substrate surface. This oxidation may be done using a known electrolysis method or by a method involving the coating of a substance that is readily oxidized.

Following the formation of the oxide thin film, the metal substrate is used as a positive electrode and platinum as a negative electrode to effect an oxidation reaction in an electrolyte solution or molten salt containing one or more metal ions to form the oxide thin film into a compound oxide thin film.

The electrolyte used for the above oxidation reaction is a saturated solution containing the metal used to form the compound oxide at a high concentration of 1M or above. The metal may be a hydroxide or salt of one or more elements that will enable the bulk critical temperature $T_c$ to be increased, such as for example lanthanum, yttrium, barium, strontium, thallium, mercury, lead, silver, and bismuth.

While the oxidation potential varies depending on the metal oxide, as a guide it is a positive potential that is higher than the standard oxidation potential used to produce an oxide of the metal concerned (for example, 1 to 10 volts). In the case of a slow reaction, the electrolytic cell is placed in a sealed container and the reaction takes place under elevated temperature and pressure conditions, at around room temperature to 200° C. when the electrolyte is an aqueous solution and at around 50° to 500° C. when the electrolyte is a molten salt. This results in the intercalation or inversion of the compound metal element or elements in the metal oxide thin film.

If lanthanum ions are being introduced into a copper substrate, the reaction will be as follows.

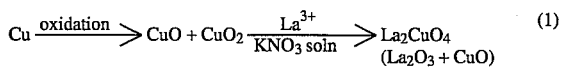

The compound oxide thin film thus obtained is used as an electrode to obtain a cyclic voltammogram in the same electrolyte.

The criteria used when the electrolytic potential for imparting superconductivity to the oxide thin film is determined from the cyclic voltammogram are (1) that there is a flow of oxidation current or reduction current, (2) that at the same potential as in the above (1) there is a large difference between the oxidation current value and the reduction current value, and (3) that oxygen gas is generated at the same potential.

The compound oxide thin film is then subjected to electrolysis at the potential determined based on the cyclic voltammogram, to thereby produce the superconductivity. The electrolysis period is usually up to one hour. The valence number of the oxide element or elements having a redox charge is controlled by this electrolysis to produce an oxide superconducting thin film. The present inventors found that compared to prior to the electrolysis there is an increase or decrease in the amount of oxygen in a thin film superconductor that has a higher critical temperature $T_c$ following the electrolysis. Therefore, by using the thus obtained compound oxide superconducting thin film having a redox charge as an electrode to generate oxygen or hydrogen under prescribed voltage conditions to thereby increase or decrease the amount of oxygen in the compound oxide superconducting thin film used as the electrode, a compound oxide superconducting thin film can be obtained.

X-ray diffraction images of the structure of the oxide superconducting thin film exhibiting a high critical temperature $T_c$ after thus adjusting the valence number of elements or the amount of oxygen in the oxide thin film showed that in the case of La-Cu-O oxide, for example, there was an increase in the split width on the X-ray spectrogram. In the case of La-Cu-O, this means that the critical temperature $T_c$ can be increased by applying electrolysis that produces an increase of the split width on the X-ray diffraction image.

The operation and effect of the invention will now be described with reference to an oxide superconducting thin film in which the metal element having a redox charge is copper.

When the surface of a copper substrate used as the positive electrode is subjected to electrolytic oxidation in an aqueous solution, hydroxide molten salt or nitrogen fused salt, in accordance with the following reaction a thin film of oxide is formed on the surface of the copper substrate.

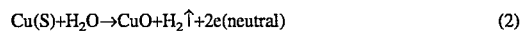

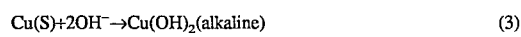

Moreover, copper in an alkaline solution or alkaline molten salt will normally form a hydroxide, but if it is electrochemically oxidized at a potential higher than 0.5 volt (using a calomel electrode as the reference electrode), the copper will become trivalent in accordance with the following redox reaction.

The present inventors found that when a copper substrate is immersed in a potassium hydroxide solution and the oxidation reaction is induced on the copper surface under the above conditions, using an iron (II) ion redox reaction to detect the amount of copper (III) from the above aqueous solution showed the average valence of copper in the oxide is in a high oxidation state. A copper substrate with the surface thus oxidized remained stable in air for at least one week.

When an oxide coated copper substrate is used as the positive electrode and platinum as the negative electrode to perform an oxidation reaction in an aqueous solution or molten salt containing ions of barium and lanthanum as the metal to be added to form the compound, as shown by the following formula, the reaction is promoted, introducing the barium and lanthanum ions into the oxide thin film to form a compound oxide thin film. This compound oxide thin film is then used as an electrode to obtain a cyclic voltammogram, and the cyclic voltammogram is then used as a basis for determining the electrolytic potential to be used to thereby produce a compound oxide superconducting thin film with a high critical temperature.

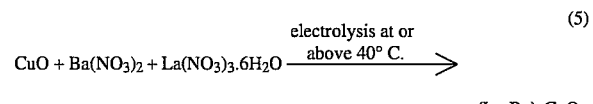

In an electrolyte solution or molten salt, copper usually dissolves mainly as copper (I) or copper (II); because of the powerful oxidizing effect, copper (III) is not stable in such a solution or molten salt. However, in the case of the present invention, even if the copper oxide used in the superconducting thin film does not dissolve in the solution or molten salt, it is exposed on the surface thereof and oxidized in a nondissolved state as copper (III) in the solution or molten salt to which a voltage is applied.

As has been described in the foregoing, the present invention enables a compound oxide superconducting thin film having a high critical temperature to be obtained by using an oxide thin film of a metal element having a redox charge as an electrode for oxidation reaction of another metal element contained in an electrolyte solution of molten salt not causing dissolution of the oxide thin film to obtain a compound oxide thin film, using the compound oxide thin film as an electrode to obtain a cyclic voltammogram and electrochemically processing the compound oxide thin film at an electrolytic potential determined on the basis of the cyclic voltammogram, and makes it possible to continuously produce the compound oxide thin film, obtain the cyclic voltammogram and electrochemically process the compound oxide thin film to exhibit superconductivity in a single electrolytic cell.

Furthermore, the present invention can be utilized as a simple method for causing a metal element having a redox charge and contained in an oxide thin film to exhibit superconductivity by controlling the number of charges of the metal element. Moreover, according to the present invention, an oxide superconducting thin film which has been difficult to produce can be obtained with ease.

EXAMPLE 1

A magnesium oxide substrate was coated with a copper (II) compound that was then dried in air and oxidized by heating and used as an electrode, immersed in an electrolyte solution consisting of a saturated solution of barium hydroxide containing a suspension of about twice the amount of lanthanum nitrate •6H$_2$O. This was heated to about 50° C. as oxidation was carried out by applying a voltage of 4 volts across the electrodes, producing a thin film of copper-barium-lanthanum-oxide (Cu-Ba-La-O) on the surface of the magnesium oxide substrate.

FIG. 1 shows the electrolysis apparatus used in the method according to this invention. Reference numeral 1 denotes an electrolytic cell containing a 1.0M solution of KOH as the electrolyte. Electrolysis is performed by passing a voltage of 0.8 to 1.0 volts between a working electrode 2 constituted by the Cu-Ba-La oxide thin film, and a platinum electrode 3. The applied potential was controlled by a potentiostat 5 using a saturated calomel electrode 4 as a reference electrode.

Figure 2:
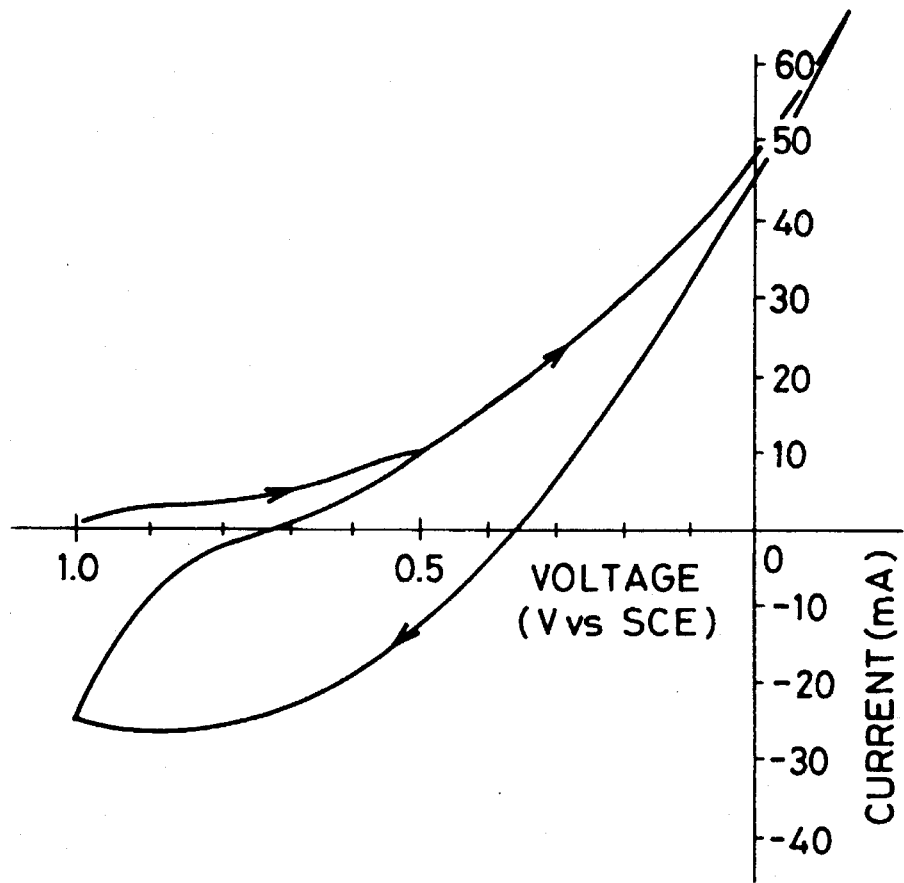
FIG. 2 is a cyclic voltammogram of a lanthanum-copper-oxygen (La-Cu-O) oxide thin film.

The thin film of Cu-Ba-La-O thus processed was then used as an electrode to obtain the cyclic voltammogram in the above suspension solution. The cyclic voltammogram thus obtained is shown in FIG. 2. The oxidation of copper (II) to copper (III) in the electrolysis process, followed by the production of oxygen, were clearly observed.

This cyclic voltammogram shows that there is a large difference between the oxidation current and the reduction current at 0.7 to 0.8 volts, so 0.8 volts (vs. the saturated calomel electrode) was determined as an oxidation potential, and the Cu-Ba-La-O thin film was therefore electrolyzed for about 0.5 hours at this potential, producing an oxide superconducting thin film having a thickness of about 500 nm.

Figure 3:
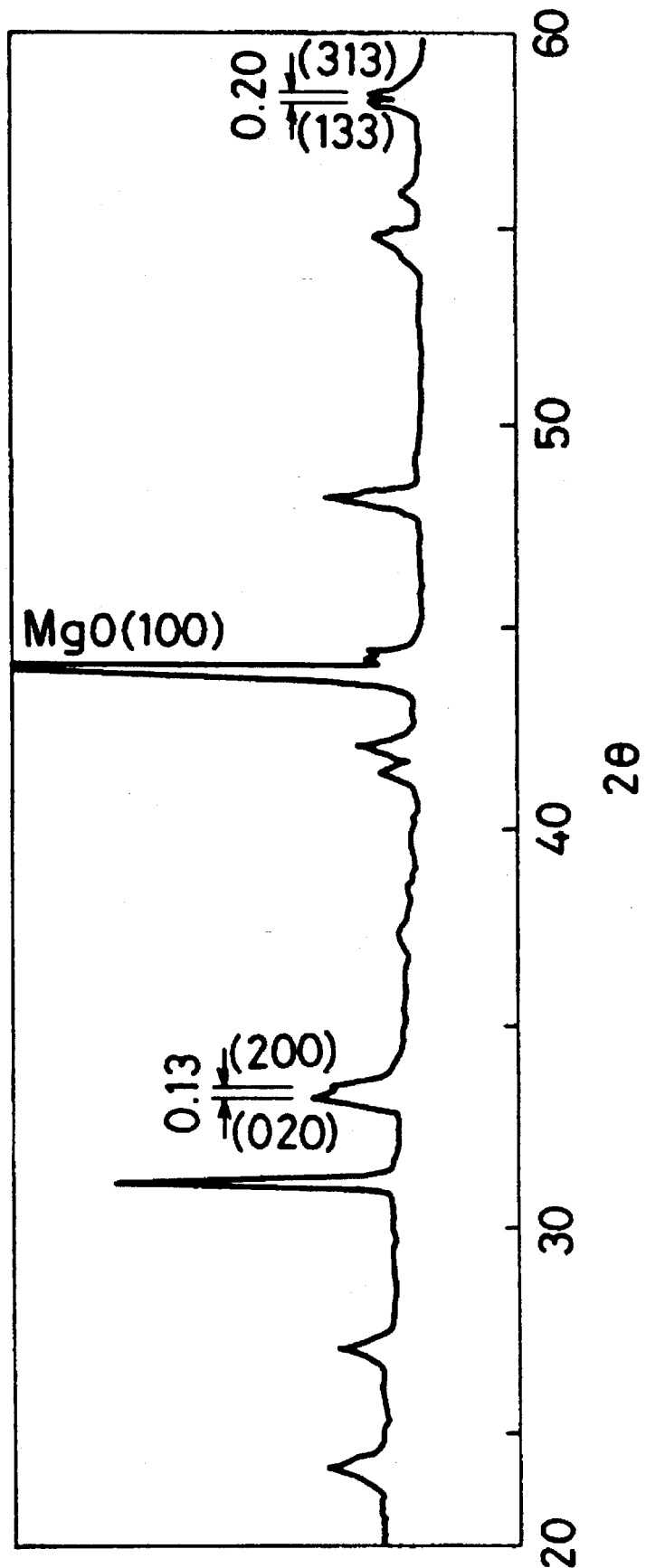
FIG. 3 shows an x-ray diffraction curve of a La-Cu-O oxide thin film obtained by the method of the invention.

This thin film was then removed from the electrolytic cell 1 and washed, and the critical temperature $T_c$ was measured and found to have increased by about 30 degrees Kelvin. FIG. 3 is an X-ray diffraction spectrogram of the thin film, showing that an increase in the split widths (204) and (024), and (133) and (313) was recognized under the higher critical temperature $T_c$ compared to before the electrolysis.

EXAMPLE 2

A molten mixture of barium hydroxide •8H$_2$O and yttrium nitrate •6H$_2$O was prepared. While the melting temperature varies depending on the proportions of each of the salts, this mixture melts at a low temperature of about 70° to 100° C. Copper was then deposited on a magnesium oxide substrate and oxidized, and the copper was then used as an electrode for electrolytic processing in a molten salt mixture consisting of 20 percent barium hydroxide and 80 percent yttrium nitrate. The electrolysis conditions were substantially the same as those used in the first example, and the electrolysis voltage was 8 volts. The oxide thus obtained was washed and examined, confirming that the thin film was a compound oxide superconducting thin film containing barium and yttrium.

Japanese Patent Application No. 5-98692 filed Apr. 1, 1993 is hereby incorporated by reference.

What is claimed is:

1. A method for producing a compound oxide superconducting thin film, comprising:

forming a thin oxide film on the surface of a substrate comprising a first metal selected from the group consisting of copper, silver and bismuth having a redox charge by oxidizing the first metal;

using the thin oxide film thus formed as an electrode for an oxidation reaction of a second metal element contained in an electrolyte solution or molten salt electrolyte to incorporate the second metal element in the thin oxide film;

using the compound thin oxide film thus formed as an electrode to obtain a cyclic voltammogram; and electrochemically processing the compound thin oxide film at an electrolytic potential that is determined from the cyclic voltammogram of the thin oxide film which is the potential at which there is a large difference between the oxidation current value and the reduction current value of the thin oxide film, so that the film exhibits superconductivity.

2. The method according to claim 1, wherein the substrate comprises a layer of the first metal supported on a base of a different material.

3. The method according to claim 2, wherein the substrate base is formed of a member selected from the group consisting of ceramic, carbon, high polymer, glass and semiconductor.

4. The method according to claim 1, wherein the substrate comprises a layer of copper supported on a base of a different material.

5. The method according to claim 4, wherein the substrate base is formed of a member selected from the group consisting of ceramic, carbon, high polymer, glass and semiconductor.

6. The method according to claim 1, wherein the oxidation reaction takes place at room temperature to 200° C. when the electrolyte is an aqueous solution and at 50° to 500° C. when the electrolyte is a molten salt.

* * * * *